United States Patent
Yuan

(10) Patent No.: US 12,205,961 B2
(45) Date of Patent: Jan. 21, 2025

(54) DISPLAY SUBSTRATE, DISPLAY PANEL AND MANUFACTURING METHOD OF DISPLAY SUBSTRATE

(71) Applicant: Shenzhen China Star Optoelectronics Semiconductor Display Technology Co., Ltd., Shenzhen (CN)

(72) Inventor: Chunge Yuan, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/622,490

(22) PCT Filed: Dec. 8, 2021

(86) PCT No.: PCT/CN2021/136587
§ 371 (c)(1),
(2) Date: Dec. 23, 2021

(87) PCT Pub. No.: WO2023/097722
PCT Pub. Date: Jun. 8, 2023

(65) Prior Publication Data
US 2024/0079416 A1   Mar. 7, 2024

(30) Foreign Application Priority Data
Dec. 1, 2021 (CN) .......................... 202111449349.X

(51) Int. Cl.
*H01L 27/12* (2006.01)
*B05D 5/12* (2006.01)
(Continued)

(52) U.S. Cl.
CPC ............ *H01L 27/1244* (2013.01); *B05D 5/12* (2013.01); *C23C 24/106* (2013.01);
(Continued)

(58) Field of Classification Search
None
See application file for complete search history.

(56) References Cited

U.S. PATENT DOCUMENTS

2009/0066236 A1* 3/2009 Sung .................. H10K 59/1315
445/24
2012/0292105 A1 11/2012 Fujita

FOREIGN PATENT DOCUMENTS

CN          1604726 A     4/2005
CN        101877335 A    11/2010
(Continued)

OTHER PUBLICATIONS

Machine-generated English translation of JP2017004715 (Year: 2017).*
(Continued)

*Primary Examiner* — Bo B Jang
(74) *Attorney, Agent, or Firm* — PV IP PC; Wei Te Chung

(57) ABSTRACT

The embodiment of the present application discloses a display substrate, a display panel and a manufacturing method of the display substrate. The display substrate comprises a base substrate and a composite structure layer. The composite structure layer comprises a conductive layer and a colloidal medium layer. The colloidal medium layer comprises a plurality of conductive particles. The plurality of conductive particles are located at a position of the colloidal medium layer close to the conductive layer to form a conductive particle part. The present application can reduce the height difference between the conductive layer and the edge of the conductive particle part, and reduce the risk of fracture or breakdown.

20 Claims, 4 Drawing Sheets

(51) Int. Cl.
*C23C 24/10* (2006.01)
*H01L 21/3205* (2006.01)
*H01L 21/768* (2006.01)

(52) U.S. Cl.
CPC ...... *H01L 27/1248* (2013.01); *H01L 27/1259* (2013.01); *H01L 21/32051* (2013.01); *H01L 21/76829* (2013.01); *H01L 21/76838* (2013.01)

(56) References Cited

FOREIGN PATENT DOCUMENTS

| CN | 102487128 A | 6/2012 |
|---|---|---|
| CN | 103038895 A | 4/2013 |
| CN | 106031312 A | 10/2016 |
| CN | 106229333 A | 12/2016 |
| CN | 107039486 A | 8/2017 |
| CN | 107706156 A | 2/2018 |
| CN | 108922918 A | 11/2018 |
| CN | 109524303 A | 3/2019 |
| CN | 109640516 A | 4/2019 |
| CN | 112002823 A | 11/2020 |
| CN | 112670311 A | 4/2021 |
| JP | 2017004715 A | 1/2017 |

OTHER PUBLICATIONS

Machine-generated English translation of CN112002823 (Year: 2020).*

International Search Report in International application No. PCT/CN2021/136587, mailed on Aug. 26, 2022.

Written Opinion of the International Search Authority in International application No. PCT/CN2021/136587, mailed on Aug. 26, 2022.

Chinese Office Action issued in corresponding Chinese Patent Application No. 202111449349.X dated Feb. 1, 2023, pp. 1-9.

* cited by examiner

DISPLAY SUBSTRATE, DISPLAY PANEL AND MANUFACTURING METHOD OF DISPLAY SUBSTRATE

CROSS-REFERENCE TO RELATED APPLICATION

This application is a national phase application under 35 U.S.C. § 371 of PCT Application No. PCT/CN2021/136587, filed Dec. 8, 2021, which claims priority to Chinese Application No. 202111449349.X, filed Dec. 1, 2021, the contents of which are incorporated herein by reference in their entirety.

FIELD OF THE INVENTION

The present application relates to a display technology field, and more particularly to a display substrate, a display panel and a manufacturing method of the display substrate.

BACKGROUND OF THE INVENTION

With the development of display technology, the application field of display panels has gradually increased. However, the resistance of the conductive layer in the display substrate of the display panel is relatively large, so that uneven display brightness occurs at the remote end corresponding to the input point during the driving process of the display substrate due to voltage attenuation or current attenuation. At present, the resistance of the conductive layer is often reduced by increasing the thickness of the conductive layer. However, in the prior art, the edge of the high-thickness conductive layer is prone to fracture or breakdown, which affects the display effect of the display substrate.

SUMMARY OF THE INVENTION

The embodiment of the present application provides a display substrate, a display panel and a manufacturing method of the display substrate to solve the problem that the edge of the high-thickness conductive layer of the display substrate is prone to fracture or breakdown in the prior art.

The embodiment of the present application provides a display substrate, comprising:
  a base substrate;
  a composite structure layer comprising a conductive layer and a colloidal medium layer sequentially arranged on the base substrate, wherein the colloidal medium layer comprises a plurality of conductive particles, and the plurality of conductive particles are located at a position of the colloidal medium layer close to the conductive layer to form a conductive particle part.

Optionally, in some embodiments of the present application, the conductive particle part and the conductive layer have the same line width.

Optionally, in some embodiments of the present application, the display substrate comprises a plurality of composite structure layers sequentially arranged along a direction away from the base substrate.

Optionally, in some embodiments of the present application, a thickness of the conductive layer is greater than or equal to 0.1 micrometer, and less than or equal to 0.6 micrometer; and/or,
  a thickness of the conductive particle part is greater than or equal to 1 micrometer, and less than or equal to 50 micrometers.

Optionally, in some embodiments of the present application, a material of the conductive layer is the same as a material of the conductive particles.

Optionally, in some embodiments of the present application, the material of the conductive particles comprises one or more of copper, aluminum and silver.

Optionally, in some embodiments of the present application, shapes of the plurality of conductive particles are the same.

Optionally, in some embodiments of the present application, the display substrate comprises an array substrate, and the array substrate comprises the composite structure layer, and the conductive layer and the conductive particle part of the composite structure layer form a first electrode layer, and the first electrode layer comprises a source and drain layer, a gate layer, a light-shielding metal layer or a first common electrode layer.

Optionally, in some embodiments of the present application, the array substrate comprises two layers of the composite structure layer; the first electrode layer of the composite structure layer close to the base substrate is the gate layer; the first electrode layer of the composite structure layer far from the base substrate is the source and drain layer.

Optionally, in some embodiments of the present application, the array substrate comprises two layers of the composite structure layer; the first electrode layer of the composite structure layer close to the base substrate is the light-shielding metal layer; the first electrode layer of the composite structure layer far from the base substrate is the gate layer.

Optionally, in some embodiments of the present application, the display substrate comprises a color filter substrate, and the color filter substrate comprises the composite structure layer, and the conductive layer and the conductive particle part of the composite structure layer form a second electrode layer, and the second electrode layer comprises a second common electrode layer.

Optionally, in some embodiments of the present application, the colloidal medium layer comprises resin.

Optionally, in some embodiments of the present application, the colloidal medium layer further comprises a curing agent, a defoaming agent, a diluent and an activator.

Optionally, in some embodiments of the present application, an insulating layer is provided on a side of the composite structure layer away from the base substrate; a thickness of the insulating layer is greater than or equal to 0.1 micrometer, and less than or equal to 1 micrometer.

Optionally, in some embodiments of the present application, the insulating layer comprises one or more of silicon nitride, silicon dioxide and silicon oxynitride.

Correspondingly, the embodiment of the present application further provides a display panel, comprising any one of the aforesaid display substrates.

Optionally, in some embodiments of the present application, the display panel further comprises a light emitting device and an encapsulation component, the light emitting device is arranged on the display substrate, and the encapsulation component is arranged on the light emitting device.

Correspondingly, the embodiment of the present application further provides a manufacturing method of a display substrate, comprising:
  providing a base substrate;
  forming a conductive layer on the base substrate;
  coating a colloidal medium layer containing conductive particles on the base substrate and the conductive layer, and depositing the conductive particles in the colloidal medium layer on the conductive layer to form a conductive particle part.

Optionally, in some embodiments of the present application, the step of coating the colloidal medium layer containing the conductive particles on the base substrate and the conductive layer, and depositing the conductive particles in the colloidal medium layer on the conductive layer to form the conductive particle part comprises:

coating the colloidal medium layer containing the conductive particles on the base substrate and the conductive layer;

implementing heat treatment to the colloidal medium layer to deposit the conductive particles in the colloidal medium layer on the conductive layer to form the conductive particle part.

Optionally, in some embodiments of the present application, after coating the colloidal medium layer containing the conductive particles on the base substrate and the conductive layer, and depositing the conductive particles in the colloidal medium layer on the conductive layer to form the conductive particle part, the manufacturing method further comprises:

forming an insulating layer on the colloidal medium layer.

The display substrate in the embodiment of the present application comprises a base substrate and a composite structure layer. The composite structure layer comprises a conductive layer and a colloidal medium layer sequentially arranged on the base substrate. The colloidal medium layer comprises a plurality of conductive particles. The plurality of conductive particles are located at a position of the colloidal medium layer close to the conductive layer to form a conductive particle part. By making the plurality of conductive particles in the colloidal medium layer to form a conductive particle part at the position close to the conductive layer, the thickness of the conductive layer can be increased and the resistance of the conductive layer can be reduced; by directly forming the colloidal medium layer on the base substrate and the conductive layer, the height difference between the conductive layer and the edge of the conductive particle part can be reduced, and the risk of fracture or breakdown of the conductive layer and the edge of the conductive particle part can be reduced.

BRIEF DESCRIPTION OF THE DRAWINGS

In order to more clearly illustrate the embodiments of the present application, the following figures will be described in the embodiments are briefly introduced. It is obvious that the drawings are only some embodiments of the present application, those of ordinary skill in this field can obtain other figures according to these figures without paying the premise.

Figure numeral description.

Figure 1:
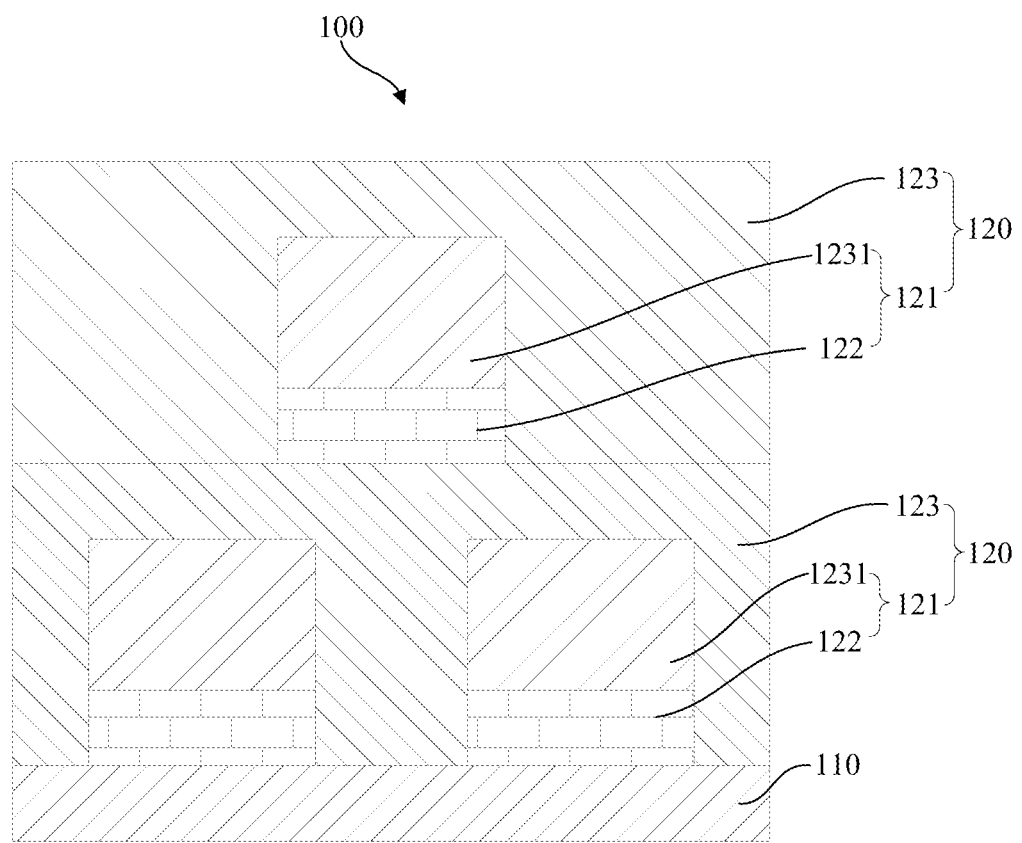
FIG. 1 is a structural diagram of a display substrate provided by an embodiment of the present application.

| FIG. numeral | Part name |
|---|---|
| 10 | Display panel |
| 100 | display substrate |
| 110 | base substrate |
| 120 | composite structure layer |
| 121 | first electrode layer |
| 122 | conductive layer |
| 123 | colloidal medium layer |
| 1231 | conductive particle part |
| 1231a | conductive particle |
| 130 | insulating layer |
| 200 | light emitting device |
| 300 | encapsulation component |

DETAILED DESCRIPTION OF PREFERRED EMBODIMENTS

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of skilled in the premise of no creative efforts obtained, should be considered within the scope of protection of the present application. Besides, it should be understood that the specific embodiments described herein are merely for illustrating and explaining the present application and are not intended to limit the present application. In this application, if no explanation is made to the contrary, the orientation words used such as "upper" and "lower" usually refer to the upper and lower of the device in actual use or working state, which specifically are the directions of the drawing in the figures; and "inner" and "outer" refer to the outline of the device.

The embodiment of the present application provides a display substrate, a display panel and a manufacturing method of the display substrate. The detail descriptions are respectively introduced below. It should be noted that the order of description in the following embodiments is not meant to limit the preferred order of the embodiments.

First, the embodiment of the present application provides a display substrate, comprising a base substrate and a composite structure layer. The composite structure layer comprises a conductive layer and a colloidal medium layer sequentially arranged on the base substrate. The colloidal medium layer comprises a plurality of conductive particles. The plurality of conductive particles are located at a position of the colloidal medium layer close to the conductive layer to form a conductive particle part.

FIG. 1 is a structural diagram of a display substrate provided by an embodiment of the present application. As shown in FIG. 1, the display substrate 100 comprises a base substrate 110 for supporting respective film structures of the display substrate 100. The adopted base substrate 110 may be a glass substrate or substrates of other types, and its specific material can be adjusted according to actual design requirements, and there is no limitation here.

The display substrate 100 comprises a composite structure layer 120. The composite structure layer 120 is arranged on the base substrate 110 and serves as a functional layer of the display substrate 100. According to different positions of the composite structure layer 120, the specific structure of the composite structure layer 120 is different, and the role of the composite structure layer 120 is also different.

The composite structure layer 120 comprises a conductive layer 122. The conductive layer 122 is arranged on the base substrate 110. According to the position of the composite structure layer 120, the conductive layer 122 corresponds to different metal film layers. After the conductive layer 122 is formed on the base substrate 110, the conductive layer 122 needs to be processed to obtain the target pattern, which is convenient for the subsequent film layer preparation.

Figure 6:
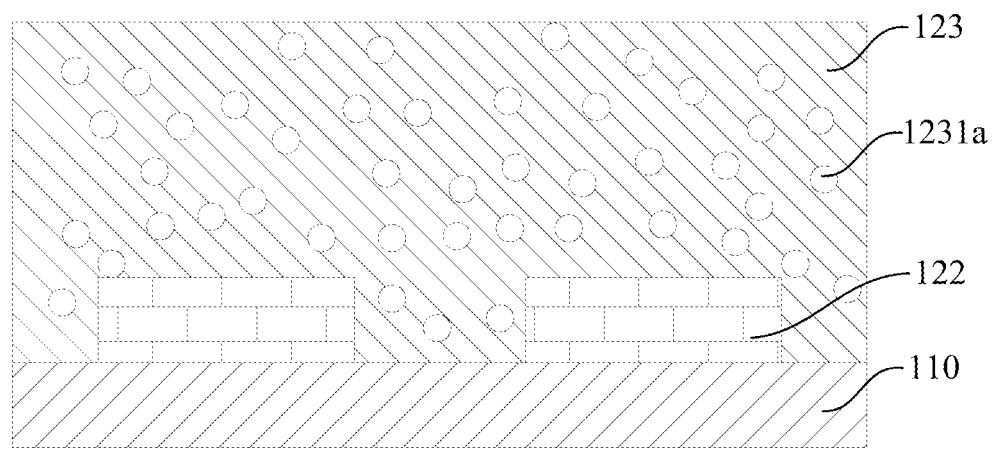
FIG. 6 is a structural diagram of step S300 in FIG. 4 according to an embodiment of the present application.
Figure 7:
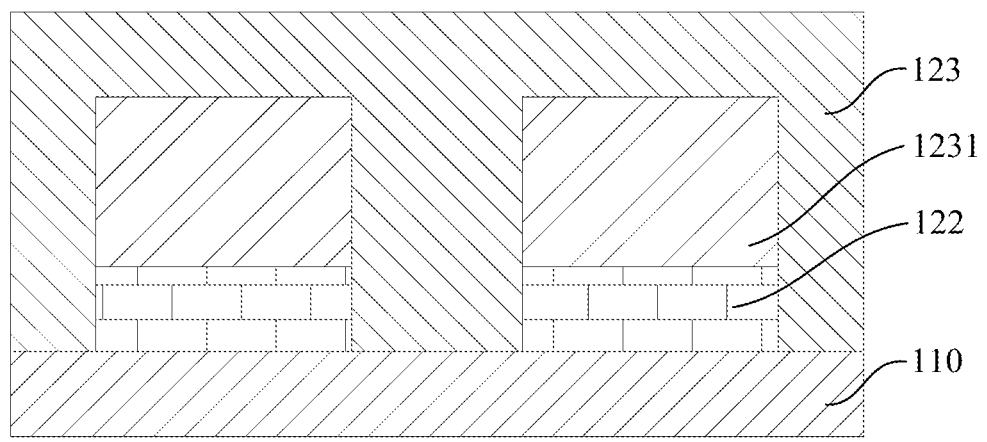
FIG. 7 is a structural diagram of step S300 in FIG. 4 according to an embodiment of the present application.

The composite structure layer 120 comprises a colloidal medium layer 123, and the colloidal medium layer 123 is arranged on the base substrate 110 and the conductive layer 122. As shown in FIG. 6 and FIG. 7, the colloidal medium layer 123 comprises a plurality of conductive particles 1231*a*. The plurality of conductive particles 1231*a* are located at a position of the colloidal medium layer 123 close to the conductive layer 122 to form a conductive particle part 1231. Namely, the conductive particle part 1231 is a part of the colloidal medium layer 123.

That the plurality of conductive particles 1231*a* are located at a position of the colloidal medium layer 123 close to the conductive layer 122 means that the plurality of conductive particles 1231*a* in the colloidal medium layer 123 are deposited on the conductive layer 122 to increase the overall thickness of the conductive layer 122 and to decrease the resistance of the conductive layer 122, to prevent uneven display brightness at the remote end corresponding to the input point during the driving process of the display substrate 100 due to voltage attenuation or current attenuation.

Specifically, before the plurality of conductive particles 1231*a* are deposited on the conductive layer 122 to form a conductive particle part 1231, the conductive particles 1231*a* are dispersed in the colloidal medium layer 123. By processing the colloidal medium layer 123, the conductive particles 1231*a* are moved to the corresponding position of the conductive layer 122 and deposited on the conductive layer 122, thereby forming the conductive particle part 1231.

The pattern shape of the conductive particle part 1231 is the same as the pattern shape of the conductive layer 122, that is, the line width of the conductive particle part 1231 and the line width of the conductive layer 122 are the same. It is avoided that when the conductive particle part 1231 is formed on the conductive layer 122, the edge of the conductive particle part 1231 and the conductive layer 122 form an undercut structure, to avoid that the conductive particle part 1231 and the edge of the conductive layer 122 break down during the use of the display substrate 100 and cause the display substrate 100 to be short-circuited and fail.

The other part of the colloidal medium layer 123 covers the conductive particle part 1231, so that the conductive particle part 1231 is separated from the subsequent film layers, so as to separate the signal metal lines between different film layers and avoid short circuits. Meanwhile, the other part of the colloidal medium layer 123 can also separate the conductive particle parts 1231 of the same layer to separate the signal metal lines in the same film layer to avoid mutual crosstalk.

The display substrate 100 in the embodiment of the present application comprises a base substrate 110 and a composite structure layer 120. The composite structure layer 120 comprises a conductive layer 122 and a colloidal medium layer 123 sequentially arranged on the base substrate 110. The colloidal medium layer 123 comprises a plurality of conductive particles 1231*a*. The plurality of conductive particles 1231*a* are located at a position of the colloidal medium layer 123 close to the conductive layer 122 to form a conductive particle part 1231. By making the plurality of conductive particles 1231*a* in the colloidal medium layer 123 to form a conductive particle part 1231 at the position close to the conductive layer 122, the thickness of the conductive layer 122 can be increased and the resistance of the conductive layer 122 can be reduced; by directly forming the colloidal medium layer 123 on the base substrate 110 and the conductive layer 122, the height difference between the conductive layer 122 and the edge of the conductive particle part 1231 can be reduced, and the risk of fracture or breakdown of the conductive layer 122 and the edge of the conductive particle part 1231 can be reduced.

Optionally, the display substrate 100 comprises a plurality of the composite structure layers 120 sequentially arranged along a direction away from the base substrate 110. The arrangement of the multiple composite layers can further reduce the resistance of the conductive layer 122, thereby reducing the internal resistance of the display substrate 100 to prevent uneven display brightness at the remote end corresponding to the input point during the driving process of the display substrate 100 due to voltage attenuation or current attenuation.

The multiple composite structure layers 120 can be arranged continuously or at intervals, that is, the conductive film layers in the display substrate 100 can all adopt the form of the composite structure layer 120, which cannot only reduce the overall internal resistance of the display substrate 100, but also can prevent the edge of the conductive film layer from fracture or breakdown, thereby improving the display effect of the display substrate 100.

Optionally, a thickness of the conductive layer 122 is greater than or equal to 0.1 micrometer, and less than or equal to 0.6 micrometer. If the thickness of the conductive layer 122 is too large, when the conductive layer 122 is etched, the line width value of the conductive layer 122 will deviate from the design value, and when the line width value of the conductive layer 122 is smaller, the conductive layer 122 is hardly to be etched; if the etching time is increased or the concentration of the developer solution is increased, over-etching is likely to occur, and even the entire surface of the conductive layer 122 may be etched away.

If the thickness of the conductive layer 122 is too small, on the one hand, the accuracy requirements of the equipment will be increased and the production cost will be increased; on the other hand, the resistance of the conductive layer 122 will be too large, which will affect the display effect. In the actual manufacturing process, the thickness of the conductive layer 122 is set to 0.1 micrometer, 0.3 micrometer, 0.5 micrometer or 0.6 micrometer, etc. The specific thickness value can be adjusted according to design requirements, and there is no special limitation here.

Optionally, a thickness of the conductive particle part 1231 is greater than or equal to 1 micrometer, and less than or equal to 50 micrometers. The conductive particle part 1231 is employed to increase the overall thickness of the conductive layer 122. If the thickness of the conductive particle part 1231 is too small, the overall thickness of the conductive layer 122 will be less changed, and the thickness of the conductive layer 122 cannot be effectively reduced to reduce the resistance of the conductive layer 122, so that the display effect of the display substrate 100 cannot be improved.

If the thickness of the conductive particle part 1231 is too large, the overall thickness of the display substrate 100 will be too large, which will increase the manufacturing cost of the display substrate 100 on one hand; on the other hand, it is not conducive to the overall structural design of the display substrate 100, and affects the display effect of the display substrate 100. In the actual manufacturing process, the thickness of the conductive particle part 1231 is set to 1 micrometer, 5 micrometer, 10 micrometer, 30 micrometer or 50 micrometer, etc. The specific thickness value can be adjusted according to design requirements, and there is no special limitation here.

It should be noted that the thickness of the conductive particle part 1231 can be adjusted according to the content of the conductive particles 1231 a in the colloidal medium layer 123 and the coating thickness of the colloidal medium layer 123. If it is necessary to increase the thickness of the conductive particle part 1231, the content of the conductive particles 1231a in the colloidal medium layer 123 is increased or the coating thickness of the colloidal medium layer 123 is increased; if it is necessary to decrease the thickness of the conductive particle part 1231, the content of the conductive particles 1231a in the colloidal medium layer 123 is decreased or the coating thickness of the colloidal medium layer 123 is decreased.

Optionally, a material of the conductive layer 122 is the same as a material of the conductive particles 1231a. Namely, the conductive layer 122 and the conductive particle part 1231 are made of the same material. When the conductive particle part 1231 is formed, the surface energy matching of the conductive particles 1231a and the conductive layer 122 and the surface tension of the conductive layer 122 make the conductive particles 1231a move in the colloidal medium layer 123 to the surface of the conductive layer 122 and are deposited. By selecting the conductive layer 122 and the conductive particles 1231a of the same material, the surface energy matching between the conductive layer 122 and the conductive particles 1231a can be improved, which is beneficial to the smooth deposition of the conductive particles 1231a on the surface of the conductive layer 122. Meanwhile, it is ensured that the conductive particle part 1231 and the conductive layer 122 possess a good structural strength, and the structural stability of the display substrate 100 is improved.

Specifically, the material of the conductive layer 122 and the material of the conductive particles 1231a can be different. It is only necessary to ensure that the conductive particles 1231a can be smoothly deposited on the conductive layer 122 under the action of the surface tension of the conductive layer 122, and that there is sufficient structural strength between the conductive layer 122 and the conductive particle part 1231 to ensure the structural stability of the display substrate 100.

Optionally, the material of the conductive particles 1231a in the embodiment of the present application comprises one or more of copper, aluminum and silver. When selecting the type of conductive particles 1231a, it is necessary to ensure that the conductive particles 1231a possess good conductivity, but also to meet the surface energy matching between the conductive particles 1231a and the conductive layer 122 to ensure that the conductive particles 1231a can be smoothly deposited on the conductive layer 122.

Optionally, the contour of the conductive particles 1231a can be spherical, ellipsoidal or other regular shapes. The shape of the conductive particles 1231a directly affects the melting temperature of the conductive particles 1231a, thereby affecting the process conditions in the manufacturing process of the display substrate 100. In the actual manufacturing process, selecting conductive particles 1231a of the same shape can ensure that the melting temperature of all conductive particles 1231a is consistent, thereby facilitating the control of process conditions in the manufacturing process and improving the production yield.

Optionally, the display substrate 100 in the embodiment of the present application comprises an array substrate, and the array substrate comprises the composite structure layer 120, and the conductive layer 122 and the conductive particle part 1231 of the composite structure layer 120 form a first electrode layer 121. When the composite structure layer 120 is located in the thin film transistor layer of the array substrate, the first electrode layer 121 is a source and drain layer or a gate layer; the source and drain layer and the gate layer are the main metal layers of thin film transistors. By increasing the thickness of the source and drain layer or the gate layer, the resistance of the source and drain layer and the gate layer can be effectively reduced, and the resistance voltage drop in the driving process of the thin film transistor layer can be reduced.

In some embodiments, when the light-shielding metal layer on the base substrate 110 also needs to carry signals, a thick film layer manufacturing process is required to reduce the resistance of the light-shielding metal layer. At this time, the light-shielding metal layer can also adopt the manufacturing method of the composite structure layer 120, that is, the first electrode layer 121 is a light-shielding metal layer.

In other embodiments, the first electrode layer 121 is the first common electrode of the array substrate, which is employed to reduce the resistance of the first common electrode and reduce the voltage drop or the current drop at different positions of the first common electrode. For the array substrate, when the thickness of a certain conductive layer 122 needs to be increased to reduce the resistance of the conductive layer 122, the composite structure layer 120 can be adopted, which can effectively increase the thickness of the conductive layer 122, and can also prevent the edge of the conductive layer 122 from fracture or breakdown, so as to ensure the stability of the array substrate.

Optionally, the array substrate comprises two layers of the composite structure layer 120; the first electrode layer 121 of the composite structure layer 120 close to the base substrate 110 is the gate layer, and the other part corresponding to the colloidal medium layer 123 in the composite structure layer 120 is an interlayer medium layer; the first electrode layer 121 of the composite structure layer 120 far from the base substrate 110 is the source and drain layer, and the other part corresponding to the colloidal medium layer 123 in the composite structure layer 120 is a planarization layer. Through the arrangement of the composite structure layer 120, the thicknesses of the gate layer and the source and drain layer in the array substrate are increased, and the voltage drop or the current drop of the metal lines of the gate layer and the source and drain layer is reduced.

Besides, the other part of the colloidal medium layer 123 in the composite structure layer 120 can not only isolate the metal lines on the gate layer and the source and drain layer, but also directly serve as the interlayer dielectric layer between the gate layer and the source and drain layer, and serve as the planarization layer on the source and drain layer without separately fabricating the corresponding film layer, which simplifies the manufacturing process; when the colloidal medium layer 123 needs to be formed with a hole, the traditional etching process can be directly employed to realize the connection of the gate layer or the source and drain layer with other film layers without increasing the difficulty of the manufacturing process.

Optionally, the first electrode layer 121 of the composite structure layer 120 close to the base substrate 110 is the light-shielding metal layer, and the other part corresponding to the colloidal medium layer 123 in the composite structure layer 120 is a buffer layer. The first electrode layer 121 of the composite structure layer 120 far from the base substrate 110 is the source and drain layer, and the other part corresponding to the colloidal medium layer 123 in the composite structure layer 120 is a planarization layer. Alternately, the first electrode layer 121 of the composite structure layer 120 close to the base substrate 110 is the light-shielding metal layer, and the other part corresponding to the colloidal medium layer 123 in the composite structure layer 120 is the buffer layer. The first electrode layer 121 of the composite structure layer 120 far from the base substrate 110 is the gate layer, and the other part corresponding to the colloidal medium layer 123 in the composite structure layer 120 is an interlayer medium layer. The specific position of the composite structure layer 120 can be adjusted according to design requirements, and there is no special restriction here.

Optionally, the display substrate 100 comprises a color filter substrate, and the color filter substrate comprises the composite structure layer 120, and the conductive layer 122 and the conductive particle part 1231 of the composite structure layer 120 form a second electrode layer. The second electrode layer comprises a second common electrode layer. The conductive layer 122 and the conductive particle part 1231 form the second common electrode layer, which can reduce the voltage drop or the current drop at different positions on the second common electrode layer, thereby ensuring the display uniformity of the color filter substrate.

Specifically, the composite structure layer 120 mainly forms an electrode layer by forming the conductive layer 122 and the conductive particle part 1231 to form a high-thickness electrode layer, which reduces the resistance of the electrode layer while avoiding edge fracture or breakdown due to the increase in the thickness of the electrode layer. In the actual manufacturing process, any electrode layer of the display substrate 100 can be configured as a composite structure layer 120 according to design requirements to meet application requirements.

Optionally, the colloidal medium layer 123 in the embodiment of the present application comprises resin, such as bisphenol A epoxy resin, etc., which is mainly employed to accommodate the conductive particles 1231a, so that the conductive particles 1231a can be dispersed in the colloidal medium layer 123 before being deposited on the conductive layer 122. The colloidal medium layer 123 further comprises a curing agent and a curing accelerator. The curing agent is employed to chemically react with the epoxy resin to form a three-dimensional network polymer, and the adopted curing agent is an amine substance; the curing accelerator is employed to react with the curing agent in the resin, to shorten the curing time of the resin gel, and facilitate the formation of the colloidal medium layer 123.

The colloidal medium layer 123 further comprises a defoaming agent, which is employed to eliminate the foam generated during the production and usage of the epoxy resin. The defoaming agent mainly comprises higher alcohol fatty acid ester complex, polyoxyethylene polyoxypropylene pentaerythritol ether, polyoxyethylene polyoxypropanolamine ether or polyoxypropylene glycerol ether and the like.

Besides, the colloidal medium layer 123 further comprises a diluent and an activator. The diluent is employed to adjust the uniformity of the colloid during the stirring process, and mainly comprises alcohol organic solvents, ether organic solvents and amide solvents, etc.; the activator is employed to reduce the surface tension of the conductive particles 1231a and promote the deposition of the conductive particles 1231a on the conductive layer 122, and mainly comprises a compound of dibasic organic carboxylic acid and hydrohalide.

Figure 2:
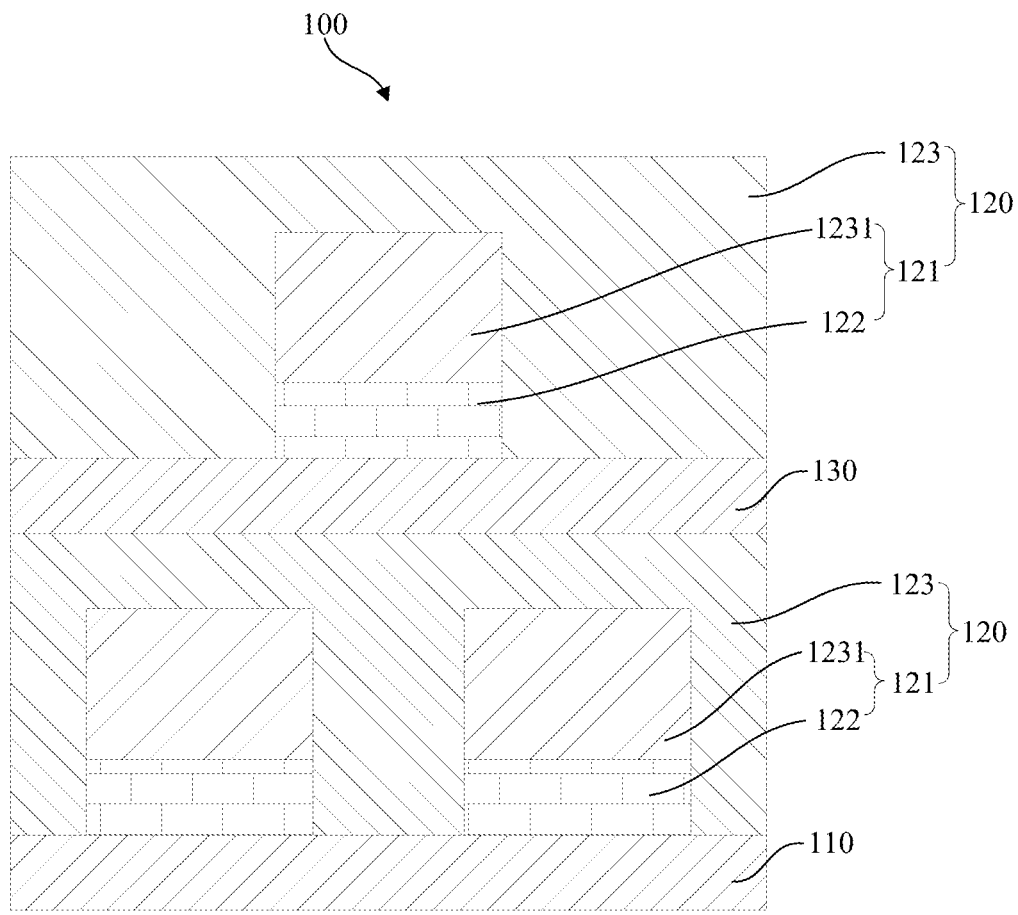
FIG. 2 is a structural diagram of another display substrate provided by an embodiment of the present application.

Optionally, as shown in FIG. 2, an insulating layer 130 is provided on a side of the composite structure layer 120 away from the base substrate 110. Since the other part of the colloidal medium layer 123 in the composite structure layer 120 is mainly organic material, it has poor barrier properties to water and oxygen in the air. The water and oxygen in the air can easily enter the interior of the display substrate 100 through the colloidal medium layer 123, to corrode the functional structure in the display substrate 100, affect the display effect of the display substrate 100, and even cause the display substrate 100 to fail.

By providing the insulating layer 130 on the side of the composite structure layer 120 away from the base substrate 110, the composite structure layer 120 can be protected. The water and oxygen in the air are prevented from entering the interior of the display substrate 100 through the colloidal medium layer 123 in the composite structure layer 120, so as to ensure the display effect of the display substrate 100.

The insulating layer 130 is made of an inorganic material, comprising one or more of silicon nitride, silicon dioxide and silicon oxynitride, which is beneficial to further improve the barrier ability of the insulating layer 130 to the water and oxygen in the air.

Optionally, a thickness of the insulating layer 130 is greater than or equal to 0.1 micrometer, and less than or equal to 1 micrometer. If the thickness of the insulating layer 130 is too small, it cannot effectively isolate the water and oxygen in the air; if the thickness of the insulating layer 130 is too large, the overall thickness of the display substrate 100 will be too large, which is not conducive to the overall structural design of the display substrate 100. In the actual manufacturing process, the thickness of the insulating layer 130 is set to 0.1 micrometer, 0.3 micrometer, 0.5 micrometer, 0.8 micrometer or 1 micrometer. It can not only ensure the barrier ability to water and oxygen in the air, but also avoid the influence on the overall structure of the display substrate 100. The specific thickness value can be adjusted accordingly according to the design requirements, and there is no special restriction here.

The embodiment of the present application provides a display panel. The display panel comprises a display substrate, and the specific structure of the display substrate refers to the aforesaid embodiments. Since this display panel adopts all the technical solutions of all the foregoing embodiments, it possesses at least all the beneficial effects brought about by the technical solutions of the foregoing embodiments, which will not be repeated here.

Figure 3:
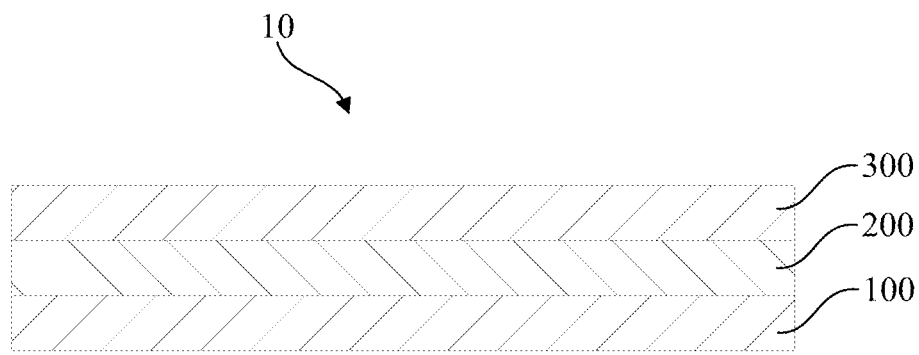
FIG. 3 is a structural diagram of a display panel provided by an embodiment of the present application.

FIG. 3 is a structural diagram of a display panel provided by an embodiment of the present application. As shown in FIG. 3, the display panel 10 comprises a display substrate 100, a light emitting device 200 and an encapsulation component 300, wherein the light emitting device 200 is arranged on the display substrate 100, and the encapsulation component 300 is arranged on the light emitting device 200.

Specifically, the display panel 10 in the embodiments of the present application possesses a wide field of applications, including televisions, computers, mobile phones, foldable and rollable display screens in other display and lighting display devices, as well as wearable devices, such as smart bracelets and smart phones. All are within the scope of the application field of the display panel 10 in the embodiments of the present application.

Figure 4:
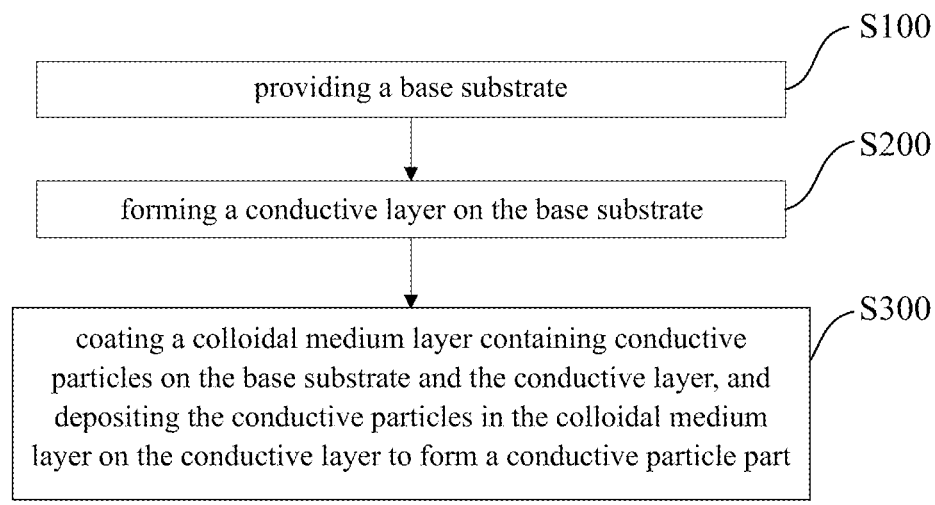
FIG. 4 is a flowchart of a manufacturing method of a display substrate provided by an embodiment of the present application.

At last, the embodiment of the present application further provides a manufacturing method of a display substrate. As shown in FIG. 4, the manufacturing method of the display substrate 100 comprises steps of:

S100, providing a base substrate 110. The adopted base substrate 110 may be a glass substrate or a flexible substrate, used to support respective film structures in the manufacturing process of the display substrate 100. Before preparing subsequent film layers, the base substrate 110 needs to be cleaned first to avoid stains on the base substrate 110 from affecting the formation of subsequent film layers, so as to ensure the structural stability of the display substrate 100.

Figure 5:
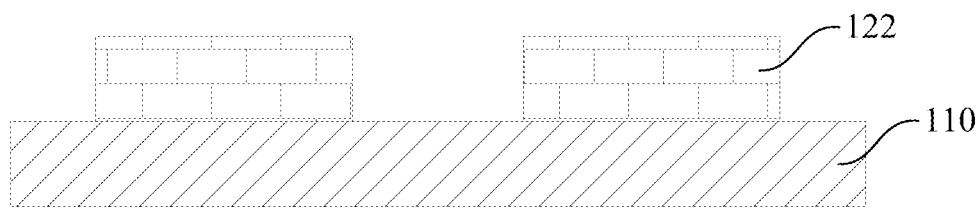
FIG. 5 is a structural diagram of step S200 in FIG. 4 according to an embodiment of the present application.

S200, forming a conductive layer 122 on the base substrate 110. As shown in FIG. 5, the physical vapor deposition method is employed to deposit the conductive layer 122 on the base substrate 110, and then according to the designed line width value, the conductive layer 122 is etched by the photolithographic process to form a target pattern layer.

The material of the conductive layer 122 comprises one or more of copper, aluminum and silver; the thickness of the conductive layer 122 is greater than or equal to 0.1 micrometer, and less than or equal to 0.6 micrometer, so as to make sure that the deposition thickness of the conductive layer 122 is within the manufacturing accuracy range of the physical vapor deposition equipment; meanwhile, it is prevented that the thickness of the conductive layer 122 is too large, when the conductive layer 122 is etched, the line width value of the conductive layer 122 will deviate from the design value, and when the line width value of the conductive layer 122 is smaller, the conductive layer 122 is hardly to be etched; if the etching time is increased or the concentration of the developer solution is increased, over-etching is likely to occur, and even the entire surface of the conductive layer 122 may be etched away.

S300, coating a colloidal medium layer 123 containing conductive particles 1231*a* on the base substrate 110 and the conductive layer 122, and depositing the conductive particles 1231*a* in the colloidal medium layer 123 on the conductive layer 122 to form a conductive particle part 1231.

As shown in FIG. 6 and FIG. 7, after the conductive layer 122 is formed on the base substrate 110, the colloidal medium layer 123 containing the conductive particles 1231*a* is coated on the base substrate 110 and the conductive layer 122. The colloidal medium layer 123 comprises resin, a curing agent, a curing accelerator, a defoaming agent, a diluent and an activator. By adjusting the content of different additives, the conductive particles 1231*a* are uniformly dispersed in the colloidal medium layer 123.

The materials of the conductive particles 1231*a* and the conductive layer 122 can be the same or different. By changing the material types of the conductive particles 1231*a* and the conductive layer 122, the surface energy matching between the conductive particles 1231*a* and the conductive layer 122 can be adjusted, to move the conductive particles 1231*a* in the colloidal medium layer 123 to the surface of the conductive layer 122 under the action of surface tension, and to be deposited on the conductive layer 122 to form the conductive particle part 1231.

Specifically, by adjusting the content of the conductive particles 1231*a* and the coating thickness of the colloidal medium layer 123, the thickness of the conductive particle part 1231 can be changed to meet the requirements of the thickness of the conductive particle part 1231. In order to ensure the uniformity of the deposition of the conductive particle part 1231 and the adjustment of the process parameters, the shapes of the plurality of conductive particles 1231*a* in the colloidal medium layer 123 are the same. That is, the plurality of conductive particles 1231*a* are all spherical or ellipsoidal or any other shapes to ensure that the melting temperature of all particles is the same, which facilitates the setting of manufacturing process parameters and simplifies the process flow.

Specifically, Step S300 mainly comprises the following content:

As shown in FIG. 6 and FIG. 7, the colloidal medium layer 123 containing conductive particles 1231*a* is coated on the base substrate 110 and the conductive layer 122, and a heat treatment is implemented to the colloidal medium layer 123 to deposit the conductive particles 1231*a* in the colloidal medium layer 123 on the conductive layer 122 to form a conductive particle part 1231. By heating the colloidal medium layer 123, the conductive particles 1231*a* in the colloidal medium layer 123 are melted. Due to the better surface energy matching between the conductive particles 1231*a* and the conductive layer 122, the molten conductive particles 1231*a* move to the conductive layer 122 in the colloidal medium layer 123, and then it is cooled down to solidify the conductive particles 1231*a* on the conductive layer 122.

When heating the colloidal medium layer 123, the temperature of the colloidal medium layer 123 is higher than the melting temperature of the conductive particles 1231*a* by 5° C. to 50° C. to ensure that the conductive particles 1231*a* are fully melted. It is avoided that the conductive particles 1231*a* cannot be completely deposited on the surface of the conductive layer 122 and affect the overall performance of the conductive particle part 1231 and the conductive layer 122.

Specifically, when the display substrate 100 comprises a plurality of composite structure layer 120, the foregoing steps can be repeated to realize the production of the plurality of composite structure layer 120. The colloidal medium layer 123 of one composite structure layer 120 can function to isolate the conductive particle part 1231 of the composite structure layer 120 from the conductive layer 122 of the adjacent composite structure layer 120. Meanwhile, according to design requirements, the colloidal medium layer 123 can be directly etched to form an opening, so as to realize the electrical connection between the conductive layer 122 and the conductive particle part 1231, which are adjacent.

Optionally, after Step S300, the manufacturing method further comprises: forming an insulating layer 130 on the colloidal medium layer 123.

Since the colloidal medium layer 123 in the composite structure layer 120 is mainly organic material except for the conductive particle part 1231, it has poor barrier properties to water and oxygen in the air. The water and oxygen in the air can easily enter the interior of the display substrate 100 through the colloidal medium layer 123, to corrode the functional structure in the display substrate 100, affect the display effect of the display substrate 100, and even cause the display substrate 100 to fail. By arranging the insulating layer 130 on the colloidal medium layer 123, the composite structure layer 120 can be protected. The water and oxygen in the air are prevented from entering the interior of the display substrate 100 through the colloidal medium layer 123 in the composite structure layer 120, so as to ensure the display effect of the display substrate 100.

In the foregoing embodiments, the description of the various embodiments have respective different emphases, and a part in some embodiment, which is not described in detail can be referred to the related description of other embodiments.

The display substrate, the display panel and manufacturing method of the display substrate provided by the embodiments of the present application are described in detail as aforementioned, and the principles and implementations of the present application have been described with reference to specific illustrations. The description of the foregoing embodiments is merely for helping to understand the technical solutions of the present application and the core ideas thereof; meanwhile, those skilled in the art will be able to change the specific embodiments and the scope of the application according to the idea of the present application. In conclusion, the content of the specification should not be construed as limiting the present application.

What is claimed is:

1. A display substrate, comprising:
   a base substrate;
   a composite structure layer comprising a conductive layer and a colloidal medium layer sequentially arranged on the base substrate, wherein the colloidal medium layer comprises a plurality of conductive particles, and the plurality of conductive particles are located at a position of the colloidal medium layer close to the conductive layer to form a conductive particle part;
   wherein the conductive particle part covers a surface of the conductive layer which is away from the base substrate; and an other part of the colloidal medium layer which excludes the conductive particle part covers side walls of the conductive layer, side walls of the conductive particle part, and a surface of the conductive particle part which is away from the conductive layer; wherein the other part of the colloidal medium layer is insulative.

2. The display substrate according to claim 1, wherein the conductive particle part and the conductive layer have the same line width.

3. The display substrate according to claim 1, wherein the display substrate comprises a plurality of the composite structure layers sequentially arranged along a direction away from the base substrate.

4. The display substrate according to claim 1, wherein a thickness of the conductive layer is greater than or equal to 0.1 micrometer, and less than or equal to 0.6 micrometer; and/or,
   a thickness of the conductive particle part is greater than or equal to 1 micrometer, and less than or equal to 50 micrometers.

5. The display substrate according to claim 1, wherein a material of the conductive layer is the same as a material of the conductive particles.

6. The display substrate according to claim 1, wherein the material of the conductive particles comprises one or more of copper, aluminum and silver.

7. The display substrate according to claim 1, wherein shapes of the plurality of conductive particles are the same.

8. The display substrate according to claim 1, wherein the display substrate comprises an array substrate, and the array substrate comprises the composite structure layer, and the conductive layer and the conductive particle part of the composite structure layer form a first electrode layer, and the first electrode layer comprises a source and drain layer, a gate layer, a light-shielding metal layer or a first common electrode layer.

9. The display substrate according to claim 8, wherein the array substrate comprises two layers of the composite structure layer; the first electrode layer of the composite structure layer close to the base substrate is the gate layer; the first electrode layer of the composite structure layer far from the base substrate is the source and drain layer.

10. The display substrate according to claim 8, wherein the array substrate comprises two layers of the composite structure layer; the first electrode layer of the composite structure layer close to the base substrate is the light-shielding metal layer; the first electrode layer of the composite structure layer far from the base substrate is the gate layer.

11. The display substrate according to claim 1, wherein the display substrate comprises a color filter substrate, and the color filter substrate comprises the composite structure layer, and the conductive layer and the conductive particle part of the composite structure layer form a second electrode layer, and the second electrode layer comprises a second common electrode layer.

12. The display substrate according to claim 1, wherein the colloidal medium layer comprises resin.

13. The display substrate according to claim 12, wherein the colloidal medium layer further comprises a curing agent, a defoaming agent, a diluent and an activator.

14. The display substrate according to claim 1, wherein an insulating layer is provided on a side of the composite structure layer away from the base substrate; a thickness of the insulating layer is greater than or equal to 0.1 micrometer, and less than or equal to 1 micrometer.

15. The display substrate according to claim 14, wherein the insulating layer comprises one or more of silicon nitride, silicon dioxide and silicon oxynitride.

16. A display panel, wherein the display panel comprises a display substrate comprising:
   a base substrate;
   a composite structure layer comprising a conductive layer and a colloidal medium layer sequentially arranged on the base substrate, wherein the colloidal medium layer comprises a plurality of conductive particles, and the plurality of conductive particles are located at a position of the colloidal medium layer close to the conductive layer to form a conductive particle part;
   wherein the conductive particle part covers a surface of the conductive layer which is away from the base substrate; and an other part of the colloidal medium layer which excludes the conductive particle part covers side walls of the conductive layer, side walls of the conductive particle part, and a surface of the conductive particle part which is away from the conductive layer; wherein the other part of the colloidal medium layer is insulative.

17. The display panel according to claim 16, wherein the display panel further comprises a light emitting device and an encapsulation component, the light emitting device is arranged on the display substrate, and the encapsulation component is arranged on the light emitting device.

18. A manufacturing method of a display substrate, comprising:
   providing a base substrate;
   forming a conductive layer on the base substrate;
   coating a colloidal medium layer containing conductive particles on the base substrate and the conductive layer, and depositing the conductive particles in the colloidal medium layer on a surface of the conductive layer which is away from the base substrate to form a conductive particle part and an other part of the colloidal medium layer which excludes the conductive particle part; wherein the other part of the colloidal medium layer covers side walls of the conductive layer, side walls of the conductive particle part, and a surface of the conductive particle part which is away from the conductive layer; wherein the other part of the colloidal medium layer is insulative.

19. The manufacturing method of the display substrate according to claim 18, wherein the step of coating the colloidal medium layer containing the conductive particles on the base substrate and the conductive layer, and depositing the conductive particles in the colloidal medium layer on the conductive layer to form the conductive particle part comprises:

coating the colloidal medium layer containing the conductive particles on the base substrate and the conductive layer;

implementing heat treatment to the colloidal medium layer to deposit the conductive particles in the colloidal medium layer on the conductive layer to form the conductive particle part.

20. The manufacturing method of the display substrate according to claim 18, wherein after coating the colloidal medium layer containing the conductive particles on the base substrate and the conductive layer, and depositing the conductive particles in the colloidal medium layer on the conductive layer to form the conductive particle part, the manufacturing method further comprises:

forming an insulating layer on the colloidal medium layer.

\* \* \* \* \*